United States Patent
Murata et al.

(10) Patent No.: US 6,230,398 B1
(45) Date of Patent: *May 15, 2001

(54) CONNECTOR MANUFACTURING METHOD

(75) Inventors: Kazuhiro Murata, Nara; Ryoji Inutsuka, Osaka; Koichi Yabuki, Nara, all of (JP)

(73) Assignee: Matsushita Electric Industrial Co., Ltd. (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/929,724

(22) Filed: Sep. 15, 1997

(30) Foreign Application Priority Data

Sep. 17, 1996 (JP) .................................... 8-244349

(51) Int. Cl.⁷ ...................................................... H05K 3/30
(52) U.S. Cl. .............................. 29/832; 29/743; 294/64.1; 414/737; 901/40
(58) Field of Search .............................. 29/720, 721, 790, 29/743, DIG. 44, 832, 840; 294/2, 64.1; 414/737, 752; 901/40, 47

(56) References Cited

U.S. PATENT DOCUMENTS

| | | | |
|---|---|---|---|
| 4,747,198 | * 5/1988 | Asai et al. ............................... | 29/407 |
| 4,794,689 | * 1/1989 | Seno et al. .............................. | 29/740 |
| 5,086,556 | * 2/1992 | Toi ......................................... | 29/740 |
| 5,088,187 | * 2/1992 | Takata et al. ........................... | 29/705 |
| 5,177,864 | * 1/1993 | Oyama .................................... | 29/833 |
| 5,336,935 | * 8/1994 | Shitanda et al. ....................... | 307/116 |
| 5,519,495 | * 5/1996 | Kawaguchi ............................. | 356/375 |
| 5,586,387 | * 12/1996 | Nakatani et al. ....................... | 29/703 |
| 5,694,219 | * 12/1997 | Kim ........................................ | 356/375 |

FOREIGN PATENT DOCUMENTS 10-107169 * 9/1997 (JP) .

* cited by examiner

*Primary Examiner*—Lee Young
*Assistant Examiner*—Kevin G. Vereene
(74) *Attorney, Agent, or Firm*—Parkhurst & Wendel, LLP

(57) ABSTRACT

The invention provides an electronic parts mounting machine and an electronic parts packaging method wherein even when a system does not include driving means, such as an XY robot, for driving a mounting head, there is no possibility of causing a decrease in measurement accuracy or a need to allocate a larger space for the installation and movement of a test unit of a lead misalignment tester. When a lead misalignment test is conducted on each lead of an electronic part, a suction nozzle is rotated and, at the same time, the test unit is moved such that the test point of the test unit scans each lead of the electronic part sucked by the suction nozzle while said test point crosses said lead.

4 Claims, 5 Drawing Sheets

CONNECTOR MANUFACTURING METHOD

FIELD OF THE INVENTION

The present invention relates to an electronic parts mounting machine and an electronic parts packaging method for mounting electronic parts on a printed circuit board.

BACKGROUND OF THE INVENTION

In electronic parts packaging machines which have heretofore been employed, a variety of electronic parts have to be tested for lead misalignment and then mounted in such a manner as to ensure high quality.

An example of a conventional electronic parts mounting machine will now be described with reference to FIG. 5.

In FIG. 5, the numeral 1 denotes a circuit board on which an electronic part 10 is to be mounted, and 2 denotes a pair of rails for carrying in and out the circuit board 1. The numeral 3 denotes parts feeding sections each comprising feeding means disposed in parallel, said parts feeding sections being fixedly disposed on opposite sides of the rails 2. The numeral 4 denotes a mounting head having a suction nozzle 5 for sucking the electronic part 10 and is vertically movable. This mounting head 4 is driven for positioning by an XY robot 6 in two directions, X-direction and Y-direction, which are orthogonal to each other in a horizontal plane.

Further, the electronic parts mounting machine is equipped with a recognition camera 7 for photographing the electronic part 10 sucked by the suction nozzle 5. The position at which the electronic part 10 is sucked by the suction nozzle 5 is measured by this recognition camera 7, it being arranged so that the latter takes in the image data for calculating the positional corrected amount to be later described. The numeral 8 denotes a lead misalignment tester for testing lead-equipped electronic parts for the misaligned state of their leads by a laser beam. The numeral 9 denotes a controller for the entire electronic parts mounting machine.

The operation of this electronic parts mounting machine will now be described. The circuit board 1 is carried in by the rails 2 and positioned and held at a predetermined electronic parts mounting position. The mounting head 4 is moved by the XY robot 6 to the parts feeding section 3 where electronic parts 10 have been stored, whereupon the mounting head 4 equipped with the suction nozzle 5 is lowered to suck an electronic part 10.

The mounting head 4 with the electronic part 10 sucked thereby is moved to a place above the recognition camera 7 and positioned there. The recognition camera 7 takes in the image of the electronic part 10 sucked by the section nozzle 5 and measures the position of the electronic part 10 to find the positional corrected amount. Upon completion of this positional correction, the electronic part 10 is moved by the mounting head 4 to the test position in the laser lead misalignment tester 8. The XY robot 6 is driven in the X- and Y-directions in such a manner that all leads on the individual sides of the electronic part 10 block the test laser irradiating spot (scan spot) of the lead misalignment tester 8, while the mounting nozzle 5 is rotated. Thereafter, only those electronic parts 10 which have been found normal by the lead misalignment test results are mounted on the circuit board 1. The circuit board 1 having undergone the mounting operation is carried out by the rails 2. The sequence described above is controlled by the controller 9.

With such electronic parts mounting machine of a conventional arrangement, however, lead misalignment tests are conducted by driving the XY robot 6 in the X- or Y-direction such that the individual leads of the electronic part 10 are moved with respect to the scan spot on the lead misalignment tester. For this reason, if the electronic parts mounting machine does not have means, such as the XY robot 6, for driving in two orthogonal directions, then it is impossible to conduct lead misalignment tests in the case of an electronic parts mounting machine of the rotary head type adapted to mount parts while rotating a plurality of heads 4.

As an approach to this difficulty, it would be contemplated to conduct lead misalignment tests by moving the test unit of the lead misalignment tester 8 in the X- and Y-directions with the electronic part 10 sucked by the mounting nozzle 5 and fixed in a predetermined position. In this case, the test unit of the lead misalignment tester 8 has to move in two different directions, i.e., X- and Y-directions, and hence errors in movement would be correspondingly increased, leading to a lowering of measurement accuracy, while a larger space has to be allocated for the installation and movement of the test unit of the lead misalignment tester 8.

DISCLOSURE OF THE INVENTION

The present invention is intended to solve the above problems and provide an electronic parts mounting machine and an electronic parts packaging method, wherein even when the equipment does not have driving means, such as an XY robot, for driving the mounting head linearly in two directions along the leads of an electronic part, lead misalignment tests can be conducted without involving a decrease in measurement accuracy or without having to allocate a larger space for the installation and movement of the test unit of the lead misalignment tester.

To solve the above problems, the electronic parts mounting machine of the present invention comprises: a parts feeding section having means for feeding electronic parts; holding means for holding a circuit board having electronic parts mounted thereon; a vertically movable mounting head for sucking and recognizing an electronic part and mounting it on a circuit board; a suction nozzle for sucking electronic parts; a nozzle rotating means for rotating the suction nozzle; a recognition camera for recognizing a sucked electronic part; a lead misalignment tester for testing electronic parts for their lead misalignment; linear driving means for linearly driving the test unit of the lead misalignment tester; and control means for rotating the suction nozzle during lead misalignment test while controlling the linear driving means to ensure that the test point of the test unit scans the leads of an electronic part sucked by the suction nozzle while crossing said leads.

The electronic parts packaging method of the present invention comprises the steps of: sucking an electronic part from a parts feeding section; recognizing and measuring the positional relationship between the suction nozzle and the leads of the electronic part by a recognition camera; rotating, on the basis of the measured data, the suction nozzle with the electronic part sucked thereby while linearly moving the test unit of the lead misalignment tester such that its test point scans the leads of the electronic part sucked by the suction nozzle while crossing said leads, thereby testing electronic parts for their lead misalignment; and mounting only those electronic parts which have been decided to be non-defective at predetermined positions on the circuit board.

According to such electronic parts mounting machine and electronic parts packaging method, lead misalignment tests can be conducted without moving the mounting head, so that lead misalignment tests can be made without requiring driving means, such as an XY robot, for linearly moving the mounting head in two directions.

Further, since the test unit of the lead misalignment tester has only to be moved linearly in one direction, it is possible to obtain higher measurement accuracy than in the case of moving the test unit of the lead misalignment tester linearly in two directions.

Further, the test unit of the lead misalignment tester is linearly moved in one direction in synchronism with the rotation of an electronic part when the latter is being rotated by the suction nozzle. Therefore, in this case it is only necessary to move the test unit of the lead misalignment tester linearly by an amount corresponding to the difference between the arcuate path taken during the rotation of the leads and the path of travel of the test point of the lead, thereby minimizing the linear distance traveled and obviating the need for providing a large space for the installation and movement of the test unit.

Further, the electronic parts mounting machine of the invention is provided with a mechanism for adjusting the vertical spacing between the lead surface of an electronic part and the lead misalignment tester, whereby lead misalignment tests can be made satisfactorily according to individual electronic parts.

DESCRIPTION OF EMBODIMENTS

An electronic parts mounting machine and an electronic parts packaging method according to embodiments of the invention will now be described with reference to FIGS. 1 through 4.

Figure 1:
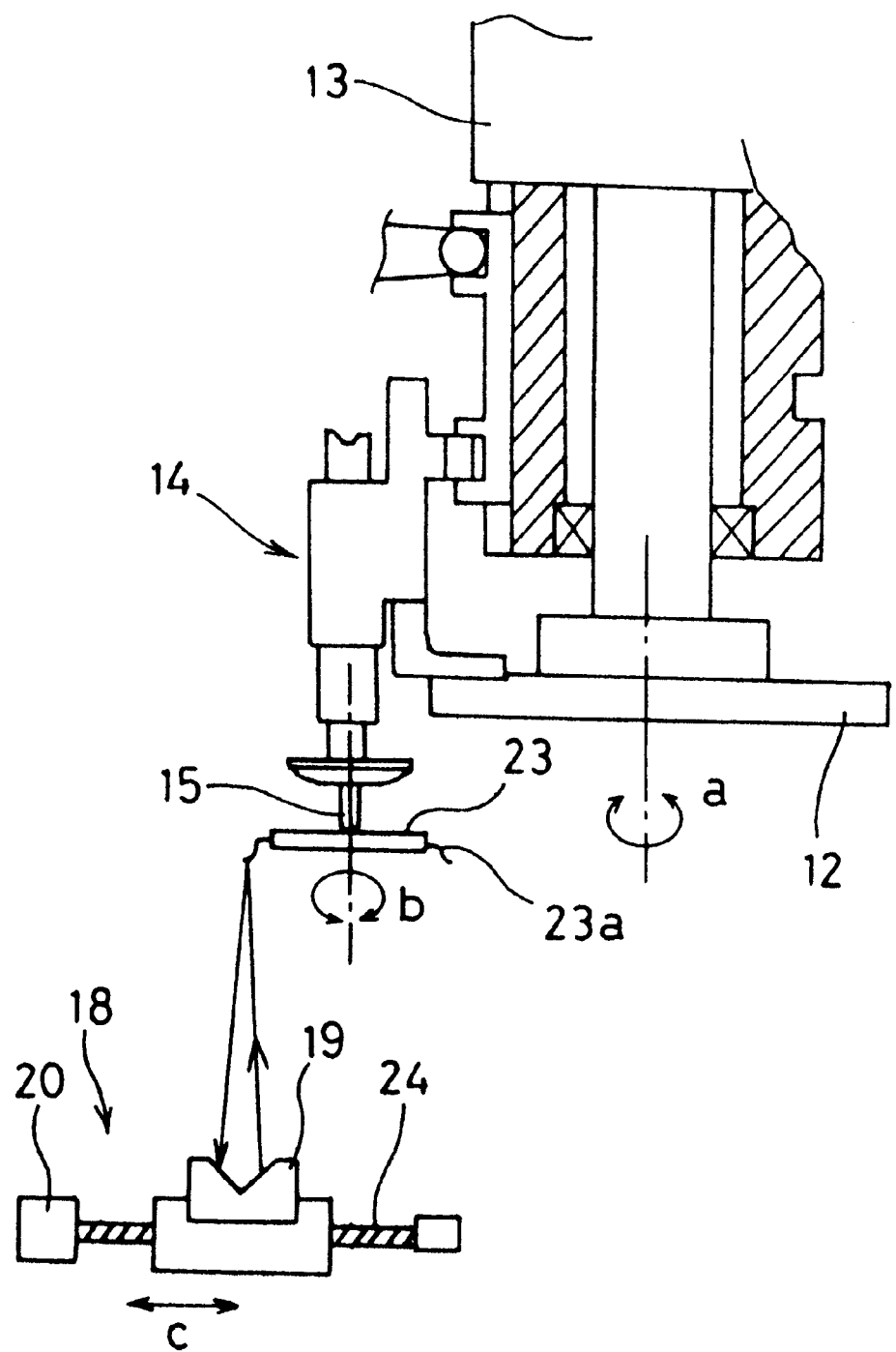
FIG. 1 is a principal front view of an electronic parts mounting machine according to an embodiment of the invention.
Figure 2:
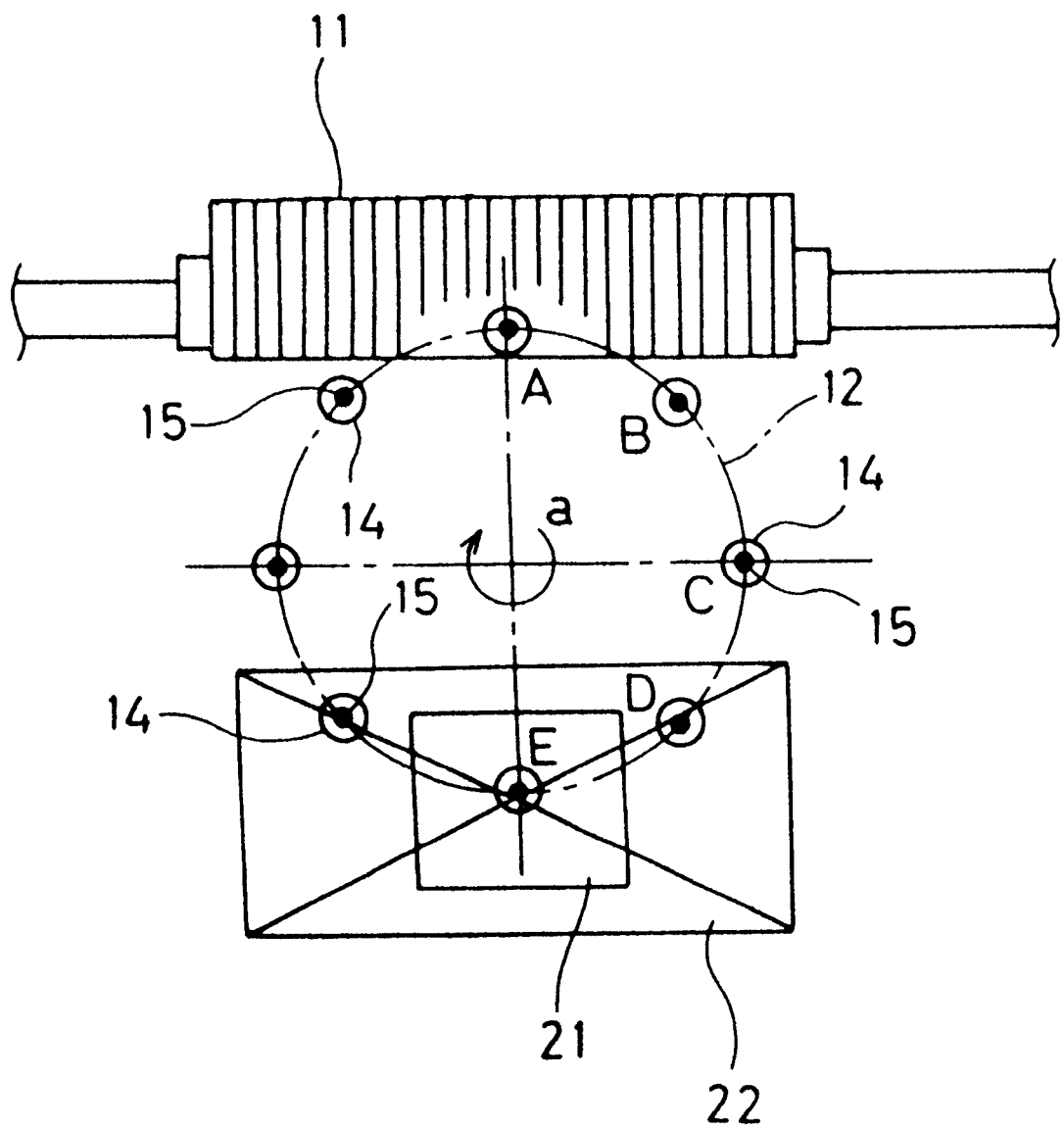
FIG. 2 is a schematic plan view of said electronic parts mounting machine.
Figure 3:
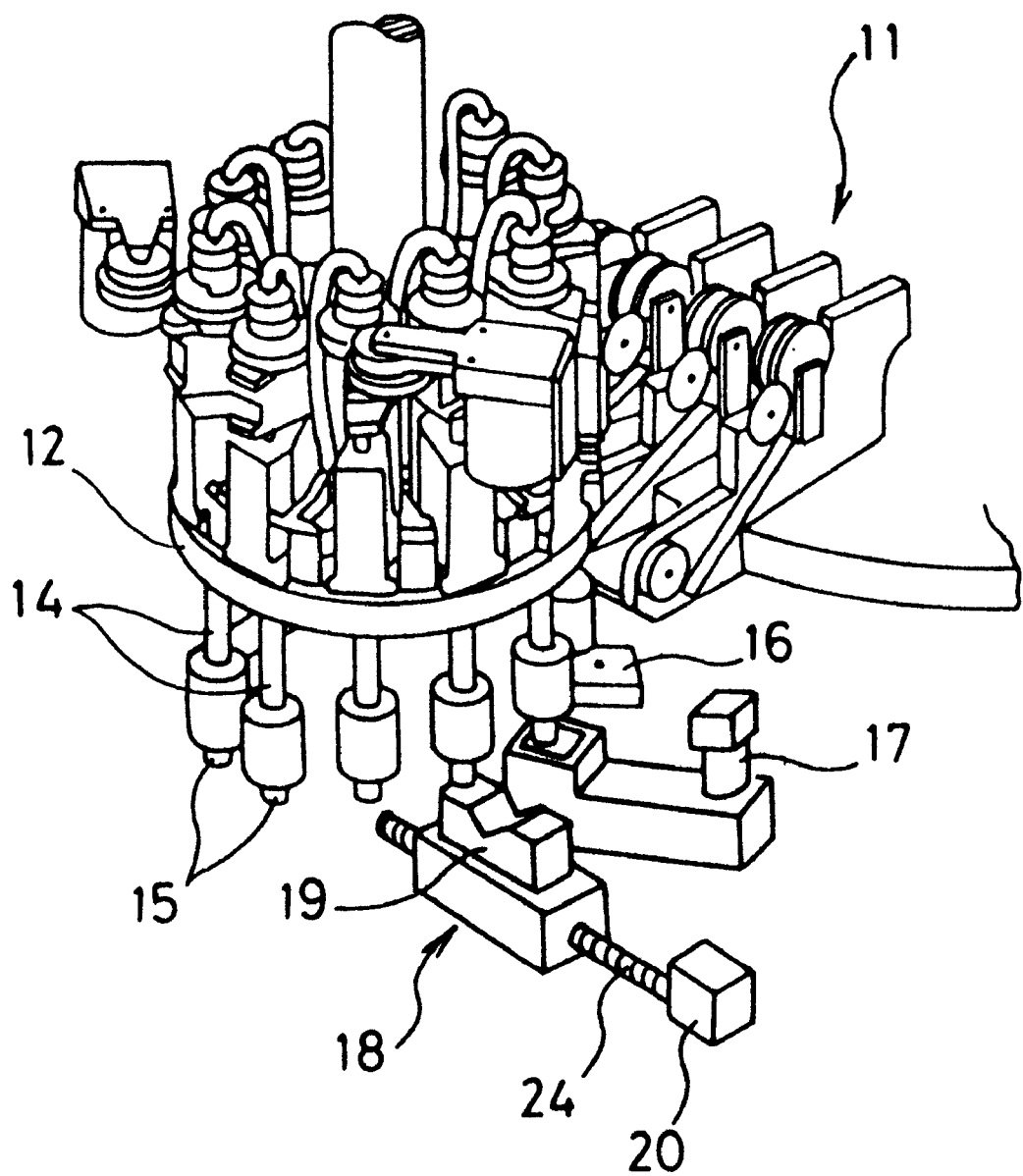
FIG. 3 is a perspective view of said electronic parts mounting machine.

In FIGS. 2 and 3, the numeral 11 denotes a parts feeding section having means disposed in parallel for feeding electronic parts 23. The numeral 12 denotes a turntable adapted to be intermittently driven for rotation in the direction of arrow a by an index unit 13. A plurality of mounting heads 14 are disposed at given intervals around the turntable 12. The mounting heads 14 are intermittently rotated. Suction nozzles 15 for sucking electronic parts 23 are installed on the lower ends of the mounting heads 14, said suction nozzles 15 being driven for rotation in the direction of arrow b by unillustrated nozzle driving means. Further, the mounting heads 14 together with the suction nozzles 15 are vertically moved by unillustrated lifting means. At one stop position for the mounting heads 14 provided by the intermittent rotation of the turntable 12, there is a parts feeding section 11. This stop position is a electronic parts feeding position A (see FIG. 2), where electronic parts 23 are fed to the mounting heads 14. In the turntable 12, the stop position where the mounting heads 14 stop next to the electronic parts feeding position A is an electronic parts regulating position B. In this stop position, there is a regulating unit 16 for regulating the electronic part 23 sucked by the suction nozzle 15 from four sides for centering. The electronic part 23 is centered by this regulating unit 16.

In the turntable 12, the stop position where the mounting heads 14 stop next to the electronic parts regulating position B is an electronic parts recognizing position C. In this stop position, there is a recognition camera 17 for measuring the corrected amount for the electronic part 23 sucked by the suction nozzle 15. The electronic part 23 is recognized by this recognition camera 17.

In the turntable 12, the stop position where the mounting heads 14 stop next to the electronic parts recognizing position C is an electronic parts lead misalignment testing position D. In this stop position, tests are conducted as to whether or not the leads of the electronic part 23 sucked by the suction nozzle 15 are misaligned. In this electronic parts lead misalignment testing position D, there is a lead misalignment tester 18 having a test unit 19. This test unit 19 is threadedly engaged on a screw shaft 24 so that the test unit 19 can be linearly driven in opposite directions c by linear driving means 20 which rotates said screw shaft,24. Further, the position of the lead misalignment tester 18 in its entirety is also adjustable.

In the turntable 12, the stop position where the mounting heads 14 stop next to the electronic parts lead misalignment testing position D is an electronic parts mounting position E. At this stop position, there is an XY table 22 for holding a circuit board 21 on which electronic parts 23 are to be mounted and positioning said circuit board 21 at a desired position.

It is arranged that the various sections of this electronic parts mounting machine are controlled by unillustrated control means.

Next, the operation of this electronic parts mounting machine will now be described.

First, the index unit 13 rotates the turntable 12 until the mounting head 14 stops at the electronic parts sucking position A. And the mounting head 14 is lowered and an electronic part 23 fed by the feeding means is sucked by the mounting nozzle 15, whereupon the suction head 14 is raised.

Thereafter, the suction nozzle 15 which has sucked the electronic part 23 stops at the electronic parts regulating position B. The mounting head 14, which stops at the electronic parts regulating position B, is lowered and the electronic part 23 sucked by the regulating unit 16 is regulated for centering from four directions by the regulating unit 16, whereupon the electronic part 23 is sucked at its center by the suction nozzle 15 again. Thereafter, the mounting head 14 is lifted and then the index unit 13 rotates the turntable 12 to move the electronic part 23 sucked by the suction nozzle 15 to the electronic parts recognizing position C.

When the mounting head 14 with the electronic part 23 sucked thereby stops at the electronic parts recognizing position C, the leads 23a of the electronic part 23 sucked by the suction nozzle 15 are recognized by the recognition camera 17. The positional relationship of the leads 23a is calculated from the center of the suction nozzle 15, the results of recognition of the leads 23a and the data on the contour of the electronic part 23. Thereafter, the index unit 13 rotates the turntable 12 to move the mounting head 14 with the electronic part 23 sucked thereby to the electronic parts testing position D.

When the mounting head 14 with the electronic part 23 sucked thereby stops at the electronic parts testing position D, the suction nozzle 15 with the electronic part 23 sucked thereby is lowered. Then, on the basis of the positional relationship found in the preceding step between the center of the suction nozzle 15 and the leads 23a of the electronic part 23, the lead misalignment tester 18 is positioned such that the distance from the suction nozzle 15 to the first of the leads 23a of the electronic part 23 to be tested is equal to the distance from the center of the suction nozzle 15 to the laser test point of the lead misalignment tester 18.

Figure 4:
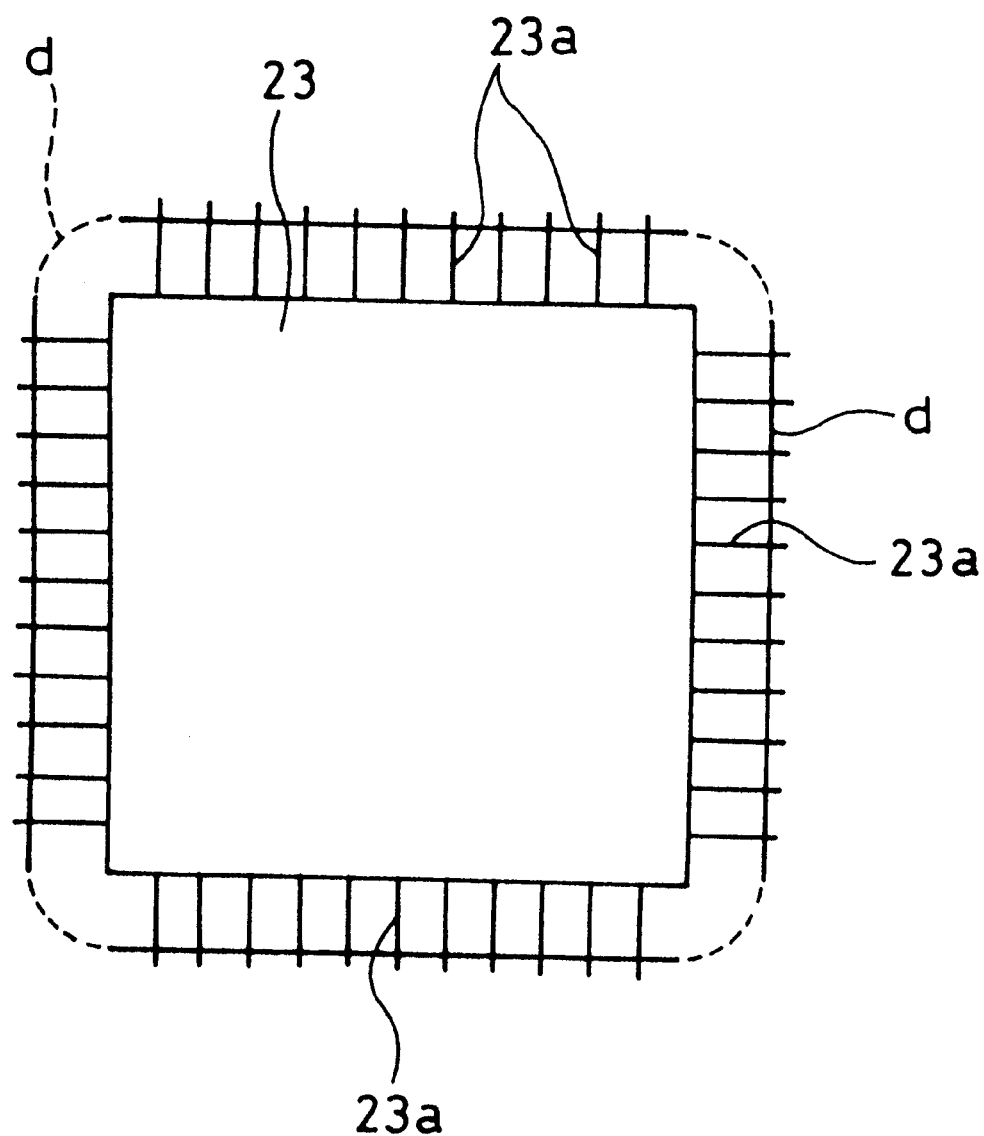
FIG. 4 is a plan view showing the path of travel of a measuring point of said electronic parts mounting machine.
Figure 5:
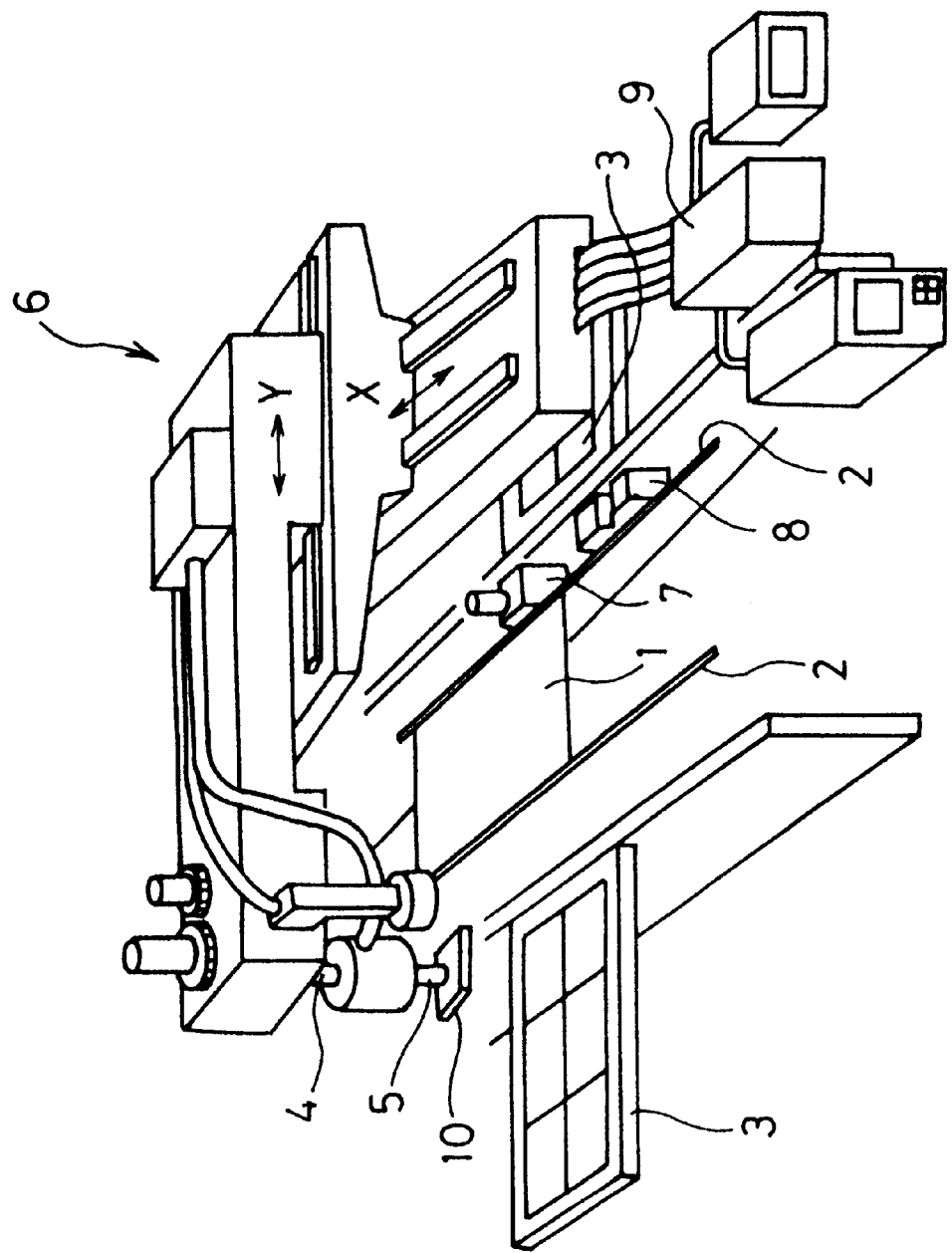
FIG. 5 is a perspective view of a conventional electronic parts mounting machine.

Thereafter, the suction nozzle 15 with the electronic part 23 sucked thereby is rotated at a constant speed. In this case, concurrently with the rotation of the suction nozzle 15, the test unit 19 is linearly driven such that the laser test point of the lead misalignment tester 18 is positioned at the tip of the lead 23a. On the basis of the positional data measured in the preceding step concerning the distance from the center of the suction nozzle 15 to the tip of each lead and also concerning the orientation of each lead, the position of each of the leads on the side of the electronic part 23 under test has already been calculated; thus, the laser test point of the lead misalignment tester 18 is controlled to move continuously on each of the leads 23a of the electronic part 23 to be tested. And the distance between the laser point and the tip of each lead 23a is measured. If one or more of these distances differ from the rest, this means that one or more leads are bent, and if the electronic part 23 including such leads 23a is placed on the flat circuit board 21, the tips of some leads 23a will be raised. In addition, the letter d in FIG. 4 shows the path of travel of the laser test point. In this manner, a lead misalignment test is conducted on the leads of each side and a decision is made as to whether the electronic part 23a is non-defective. It is arranged that only the electronic part 23 which has been found non-defective is mounted in the next step, and the mounting head 14 with the electronic part 23 sucked thereby is moved to the electronic parts mounting position B.

In addition, the mounting head 14 is raised and lowered according to the data on the electronic part 23, and the vertical spacing between the lead surface of the electronic part 23 and the lead misalignment tester 18 is adjusted. Thereby, a lead misalignment test is made according to each electronic part 23.

When the mounting head 14 with the electronic part 23 sucked thereby stops at the electronic parts mounting position E, the mounting head 14 is lowered and the electronic part 23 sucked by the suction nozzle 15 is mounted at a predetermined position on the circuit board 21 positioned on the XY table 22. Thereafter, the mounting head 14 is lifted and the turntable 12 is rotated and the same operation is performed for the next electronic part 23.

The mounting operation of electric parts 23 described so far is repeated to mount electronic parts 23 successively at predetermined positions on the circuit board 21.

Thus, since lead misalignment tests can be made without moving the mounting head 14, it is possible to dispense with driving means, such as an XY robot, for linearly driving the mounting head in two directions. Further, since the test unit 19 of the lead misalignment tester 18 has only to be moved linearly in one direction, higher accuracy can be obtained than in the case of moving the test unit 19 of the lead misalignment tester 18 linearly in two directions. Further, since the test unit 19 of the lead misalignment tester 18 is linearly moved in one direction in synchronism with the rotation of the electronic part 23 when the latter is being rotated by the suction nozzle 15, it is only necessary for the test unit 19 of the lead misalignment tester 18 to move linearly by an amount corresponding to the difference between the arcuate path taken during the rotation of the leads and the path of travel of the test point of the lead 23a, thereby minimizing the linear distance traveled and obviating the need for providing a large space for the installation and movement of the test unit 19.

In addition, the present embodiment has been described as applied to a rotary head type electronic parts mounting machine. However, the invention is also applicable to a type in which the mounting head 14 is moved by an XY robot.

Further, when it is desired to conduct a lead misalignment test, the suction nozzle 15 for sucking an electronic part 23 has been vertically moved under control by lifting and lowering the mounting head 14 according to the data on the electronic part 23. However, the same effects can also be obtained by controlling the lead misalignment tester 18 to be moved in the direction of the height.

As has been described so far, according to the present invention, when it is desired to conduct a lead misalignment test, at the same time as the suction nozzle 15 is rotated, the test unit 19 is moved in synchronism with this rotation to cause the test point of the test unit 19 to scan a lead of an electronic part sucked by the suction nozzle 15 while said test point crosses the lead. Therefore, lead misalignment tests can be conducted without regard to the absence of driving means, such as an XY robot, for driving the mounting head in X- and Y-directions. Thus, lead misalignment tests can also be conducted without any trouble on a rotary head type electronic parts mounting device. Furthermore, since there is no possibility of causing a lowering of measurement accuracy, high reliability in lead misalignment tests is assured. And since there is no need to provide a larger space for the installation and movement of the lead misalignment tester, the increase in the size of the device can be minimized.

What is claimed is:

1. An electronic parts mounting machine comprising:
  a parts feeding section having means for feeding electronic parts;
  a xy table for holding a circuit board having electronic parts mounted thereon and positioning the circuit board at a desired position;
  a vertically movable mounting head for sucking and recognizing an electronic part and mounting it on a circuit board;
  a suction nozzle for sucking electronic parts;
  a nozzle rotating means for rotating the suction nozzle;
  a regulating unit for regulating the electronic part, which has been sucked by the suction nozzle, for centering the electronic part on the suction nozzle;
  a recognition camera for recognizing a sucked electronic part;

a lead misalignment tester for testing electronic parts for defective leads and lead misalignment, said tester being separate from said XY table;

linear driving means for linearly driving a test unit of the lead misalignment tester; and control means for rotating the suction nozzle during lead misalignment testing while controlling the linear driving means to ensure that a test point of a test unit scans each lead of an electronic part sucked by the suction nozzle while crossing said lead.

2. An electronic parts mounting machine as set forth in claim 1, wherein a vertical spacing between a lead surface of the electronic part and the lead misalignment tester is adjusted on a basis of the data on a electronic part.

3. An electronic parts packaging method comprising the steps of:

sucking an electronic part from a parts feeding section;

recognizing and measuring data relating to a positional relationship between a suction nozzle and each lead of the electronic part by a recognition camera;

rotating, on the basis of the measured data, the suction nozzle with the electronic part sucked thereto while linearly moving a test unit of a lead misalignment tester such that a test point scans the leads of the electronic part sucked by the suction nozzle while crossing said leads, thereby testing misalignment of each lead of the electronic part to determine whether the electronic part is defective; and mounting only those electronic parts which have been decided to be non-defective at predetermined positions on a circuit board.

4. An electronic parts mounting machine as set forth in claim 1, wherein the parts feeding section, the regulating unit, the recognition camera, the lead misalignment tester and the XY table are arranged in such sequential order in the direction of rotation of the mounting head.

* * * * *